United States Patent
Skibinski et al.

(10) Patent No.: US 10,629,396 B2
(45) Date of Patent: Apr. 21, 2020

(54) ARC FLASH RESISTANT ENCLOSURE WITH SEGREGATED COOLING

(71) Applicant: Rockwell Automation Technologies, Inc., Mayfield Heights, OH (US)

(72) Inventors: Gary L. Skibinski, Milwaukee, WI (US); Nickolay N. Guskov, Mequon, WI (US); Steven J. Krautkramer, West Bend, WI (US); Jesus Mariscal, Wauwatosa, WI (US); James P. Clavette, West Bend, WI (US); Zhijun Liu, Colgate, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 349 days.

(21) Appl. No.: 15/720,285

(22) Filed: Sep. 29, 2017

(65) Prior Publication Data

US 2018/0323022 A1  Nov. 8, 2018

Related U.S. Application Data

(60) Provisional application No. 62/503,246, filed on May 8, 2017.

(51) Int. Cl.
*H05K 5/00* (2006.01)
*H01H 33/08* (2006.01)
(Continued)

(52) U.S. Cl.
CPC ............ *H01H 33/08* (2013.01); *H02B 1/565* (2013.01); *H02B 13/025* (2013.01); *H02H 3/16* (2013.01); *H05K 7/20145* (2013.01)

(58) Field of Classification Search
None
See application file for complete search history.

(56) References Cited

U.S. PATENT DOCUMENTS

| | | |
|---|---|---|
| 4,602,200 A | 7/1986 | Walker |
| 5,623,191 A | 4/1997 | Wieloch |

(Continued)

FOREIGN PATENT DOCUMENTS

| | | |
|---|---|---|
| CN | 1578128 A | 2/2005 |
| CN | 202285365 U | 6/2012 |

(Continued)

OTHER PUBLICATIONS

Extended European Search Report dated Oct. 10, 2016 for European Application No. 14188255.5-1905.

(Continued)

*Primary Examiner* — Stephen W Jackson
(74) *Attorney, Agent, or Firm* — Fay Sharpe LLP

(57) ABSTRACT

Disclosed examples include enclosures with segregated or divided cooling paths and improved arc flash resistance. In one example, a TYPE 12, 50 DEGREE C. ambient common bus power conversion enclosure design provides enhanced arc flash protection & segregated cooling for high reliability of imbedded electronics. Example enclosures and systems can be used in association with AC/DC converters for motor drives or motor control centers, and/or for electroplating or painting systems with modular anode control (MAC) systems to implement an anodic DC electroplating for workpieces and other end use applications.

18 Claims, 9 Drawing Sheets

(51) Int. Cl.
　　　*H02H 3/16*　　　(2006.01)
　　　*H05K 7/20*　　　(2006.01)
　　　*H02B 13/025*　　(2006.01)
　　　*H02B 1/56*　　　(2006.01)

(56) References Cited

U.S. PATENT DOCUMENTS

| | | | |
|---|---|---|---|
| 6,094,346 A * | 7/2000 | Schweers | G06F 1/20 |
| | | | 165/121 |
| 6,198,647 B1 | 3/2001 | Zhou et al. | |
| 6,208,537 B1 | 3/2001 | Skibinski et al. | |
| 6,335,872 B1 | 1/2002 | Zhou et al. | |
| 6,402,324 B1 * | 6/2002 | Kuroda | G03B 21/006 |
| | | | 353/31 |
| 6,440,567 B1 * | 8/2002 | Choate | C08K 3/02 |
| | | | 428/418 |
| 6,549,434 B2 | 4/2003 | Zhou et al. | |
| 7,375,490 B2 | 5/2008 | Furem | |
| 7,626,836 B2 | 12/2009 | Leggate et al. | |
| 7,778,013 B2 | 8/2010 | Bruski et al. | |
| 8,299,732 B2 | 10/2012 | Hoadley et al. | |
| 9,237,663 B2 | 1/2016 | Bugaris et al. | |
| 2004/0263284 A1 | 12/2004 | Terakawa et al. | |
| 2005/0105306 A1 | 5/2005 | Deng et al. | |
| 2005/0276017 A1 | 12/2005 | Aziz et al. | |
| 2007/0058400 A1 | 3/2007 | Kimura et al. | |
| 2007/0212910 A1 | 9/2007 | Tracy et al. | |
| 2008/0049468 A1 | 2/2008 | Wei et al. | |
| 2008/0150462 A1 | 6/2008 | Miettinen | |
| 2009/0058350 A1 | 3/2009 | Wei et al. | |
| 2009/0276165 A1 | 11/2009 | Weiss et al. | |
| 2010/0078998 A1 | 4/2010 | Wei et al. | |
| 2010/0079230 A1 | 4/2010 | Wei et al. | |
| 2010/0080024 A1 | 4/2010 | Wei et al. | |
| 2010/0159816 A1 | 6/2010 | Huels et al. | |
| 2010/0327799 A1 | 12/2010 | Broussard et al. | |
| 2010/0328883 A1 | 12/2010 | Ledezna et al. | |
| 2011/0101897 A1 | 5/2011 | Wei et al. | |
| 2011/0103096 A1 | 5/2011 | Wei et al. | |
| 2011/0103105 A1 | 5/2011 | Wei et al. | |
| 2011/0153234 A1 | 6/2011 | Winterhalter et al. | |
| 2011/0286244 A1 | 12/2011 | Wei et al. | |
| 2011/0295437 A1 | 12/2011 | Lu et al. | |
| 2011/0309875 A1 | 12/2011 | Wei et al. | |
| 2012/0014042 A1 | 1/2012 | Tallam et al. | |
| 2012/0014063 A1 | 1/2012 | Weiss | |
| 2012/0262969 A1 | 10/2012 | Nagano et al. | |
| 2013/0093376 A1 | 4/2013 | Yoo | |
| 2013/0106328 A1 | 5/2013 | Kopiness et al. | |
| 2013/0241451 A1 | 9/2013 | Wei et al. | |
| 2013/0242623 A1 | 9/2013 | Wei et al. | |
| 2013/0342138 A1 | 12/2013 | Permuy | |
| 2014/0260397 A1 | 9/2014 | Agnaou et al. | |
| 2015/0098257 A1 | 4/2015 | Wei et al. | |
| 2017/0131750 A1 * | 5/2017 | Sato | G06F 1/20 |

FOREIGN PATENT DOCUMENTS

| | | | |
|---|---|---|---|
| CN | 202856646 U | 4/2013 | |
| CN | 105580502 A | 5/2016 | |

OTHER PUBLICATIONS

Office Action issued by the State Intellectual Property Office for Chinese Patent Application No. 201410524981.X dated Sep. 29, 2016.

European Search Report, dated Aug. 29, 2018, in connection with European Application No. 18171181.3.

Chinese Search Report, dated Sep. 30, 2019, in connection with Chinese Application No. 201810410165.4.

* cited by examiner

ARC FLASH RESISTANT ENCLOSURE WITH SEGREGATED COOLING

CROSS REFERENCE TO RELATED PATENTS AND APPLICATIONS

This application claims priority to and the benefit of the filing date of U.S. Provisional Patent Application Ser. No. 62/503,246, filed May 8, 2017, which application is hereby incorporated by reference.

BACKGROUND INFORMATION

Electrical enclosures and cabinets can be used in a wide range of industrial and automation applications. In general, electrical enclosures typically include a shell or box made of a heavy gauge sheet metal. The enclosures are configured to support electrical circuitry and electrical components therein, and to receive and send electrical power and data signals. The enclosures may include both small and large individual units, such as for housing components, such as contactors and other switches. Further, larger enclosures can be employed to house various power electronics equipment, control circuits, motor drives, and so forth. For example, in industry it is common to find large enclosures divided into bays or segments for single and three-phase switches, motor controllers, programmable logic controllers, data and power network interfaces, and so forth.

One challenge in the design and operation of electrical components in enclosures relates to designing the enclosures to withstand the mechanical and thermal effects of an internal arcing fault (also called an arc, arc fault, arc flash, arcing flash, etc.). For example, certain types of electrical faults can produce arcs that can heat and even vaporize neighboring components and cause sudden pressure increases and localized overheating. While development of protective circuitry has focused on interrupting such faults extremely quickly, even a few cycles of alternating current can suffice to vaporize wires, insulation, and even component housings. Such faults can result in volumes of hot gas that expand and must be channeled and/or vented within or from the enclosure. Further, the faults can produce high temperatures and pressure increases that cause mechanical and thermal stresses on the electrical enclosures. Arcing faults can cause damage to equipment and facilities and increase costs due to lost production. They can also present a hazard to personnel in the vicinity due to the location of operator controls on the front door of some enclosures. Accordingly, industrial standards and guides have been developed as a way for manufacturers to demonstrate that the electrical enclosures can withstand the mechanical and thermal effects of an internal arcing fault.

Another challenge in the design and operation of electrical components in enclosures relates to cooling of the electrical components within the enclosure and providing a degree of environmental protection against dust and moisture in the external ambient environment. Air cooled enclosures generally have one or more filtered or unfiltered intake vents and one or more exhaust vents configured as part of a flow path for ambient air to be drawn into the enclosure. The ambient air drawn into the enclosure absorbs heat from the internal components and is then exhausted back to the ambient environment. The intake and exhaust vents, while necessary for air cooling, present challenges with respect to the potential for arc plasma to escape therefrom in the event of an arc fault.

BRIEF DESCRIPTION

Disclosed examples include enclosures with segregated or divided cooling paths and improved arc flash resistance. In one example, a TYPE 12, 50 C RATED ambient common bus power conversion enclosure design provides enhanced arc flash protection and segregated cooling for high reliability of imbedded electronics with a degree of protection against circulating dust, falling dirt and dripping noncorrosive liquids. Example enclosures and systems can be used in association with AC/DC converters for electroplating or painting systems with modular anode control (MAC) systems to implement an anodic DC electroplating for workpieces and other end use applications. Other example enclosures and systems find wide use in a variety of applications.

In accordance with one aspect of the present disclosure, an enclosure comprises a first compartment to operate at a first controlled temperature range, the first compartment including a variable frequency drive, a second compartment to operate at a second controlled temperature range higher than the first controlled temperature range, the second compartment including magnetics and higher temperature rated components, a first intake vent to receive ambient air into the first compartment, a second intake vent to receive ambient air into the second compartment, and a blower to direct air from both the first and second compartments out of the enclosure. The ambient air drawn into the first compartment flows along a first cooling path extending from the first intake vent to the blower, the ambient air drawn into the second compartment flows along a second cooling path extending from the second intake vent to the blower, and a terminal portion of the first flow path joins the second flow path prior to the blower.

The enclosure can further include a partition at least partially separating the first compartment from the second compartment, and at least one opening in the partition through which the first flow path extends from the first compartment into the second compartment. The at least one opening can be at an upper portion of the partition adjacent a top panel of the enclosure. At least one door can be provided for accessing the first compartment. The at least one door can include the first intake vent, wherein the first intake vent is the only pathway to the ambient environment through the door. The blower can be a TYPE 12, 50 degree C. enclosure with 2-speed control, or any other suitable blower (e.g., continuously variable speed). A first arc flash path of the first compartment can extend between the first intake vent and the blower (exhaust outlet), the arc flash path making at least two 90 degree turns prior to the blower. A second arc flash path of the second compartment can extend between the second intake vent and the blower (exhaust outlet), the first arc flash path and the second arc flash path being coextensive within at least a portion of the second compartment. Both the first arc flash path and the second arc flash path can exit the enclosure through a top side of the enclosure (e.g., via the exhaust outlet of the blower).

The arc flash paths of the present exemplary disclosure dissipate arc energy by increasing the length the arc must travel before exiting the enclosure, and forcing the arc to undergo at least two directional changes prior to exiting the enclosure. Accordingly, in some instances an arc emanating from a lower portion of either of the compartments may be diminished by 75% or more prior to exiting the enclosure.

In accordance with another aspect, an enclosure for electrical equipment comprises a low temperature compartment to operate at a first controlled temperature range, the low temperature compartment configured to house a first set of associated electrical components, a high temperature compartment to operate at a second controlled temperature range higher than the first controlled temperature range, the high temperature compartment configured to house a second set of associated electrical/electronic components, a first intake vent to receive ambient air into the low temperature compartment, a second intake vent to receive ambient air into the high temperature compartment, and a blower to direct air from both the low temperature compartment and the high temperature compartment out of the enclosure. Ambient air entering the low temperature compartment flows along a first cooling path extending from the first intake vent to the blower, ambient air entering the high temperature compartment flows along a second cooling path extending from the second intake vent to the blower, and a terminal portion of the first flow path joins the second flow path prior to the blower.

The enclosure can further comprise a partition at least partially separating the low temperature compartment from the high temperature compartment within the enclosure, and at least one opening in the partition through which the first flow path extends from the low temperature compartment into the high temperature compartment. The at least one opening can be at an upper portion of the partition adjacent a top panel of the enclosure. At least one door for accessing the first compartment can be provided. The at least one door can include the first intake vent, wherein the first intake vent is the only pathway to the ambient environment through the door. The blower can be a TYPE 12, 50 degree C. 2-speed blower (or continuously variable speed). A first arc flash path of the low temperature compartment can extend between the first intake vent and the blower, the arc flash path making at least two 90 degree turns prior to the blower. A second arc flash path of the high temperature compartment can extend between the second intake vent and the blower, the first arc flash path and the second arc flash path being coextensive within at least a portion of the second compartment. Both the first arc flash path and the second arc flash path can exit the enclosure through a top side of the enclosure.

DETAILED DESCRIPTION

Figure 3:
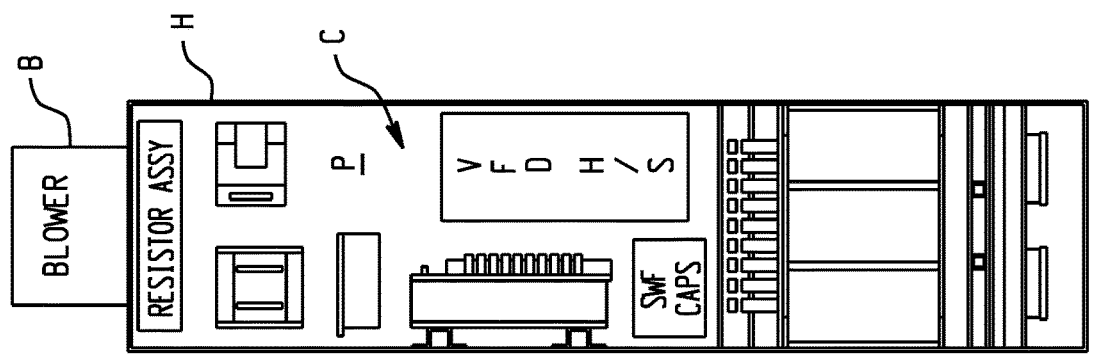
FIG. 3 is a back view of the exemplary enclosure.
Figure 2:
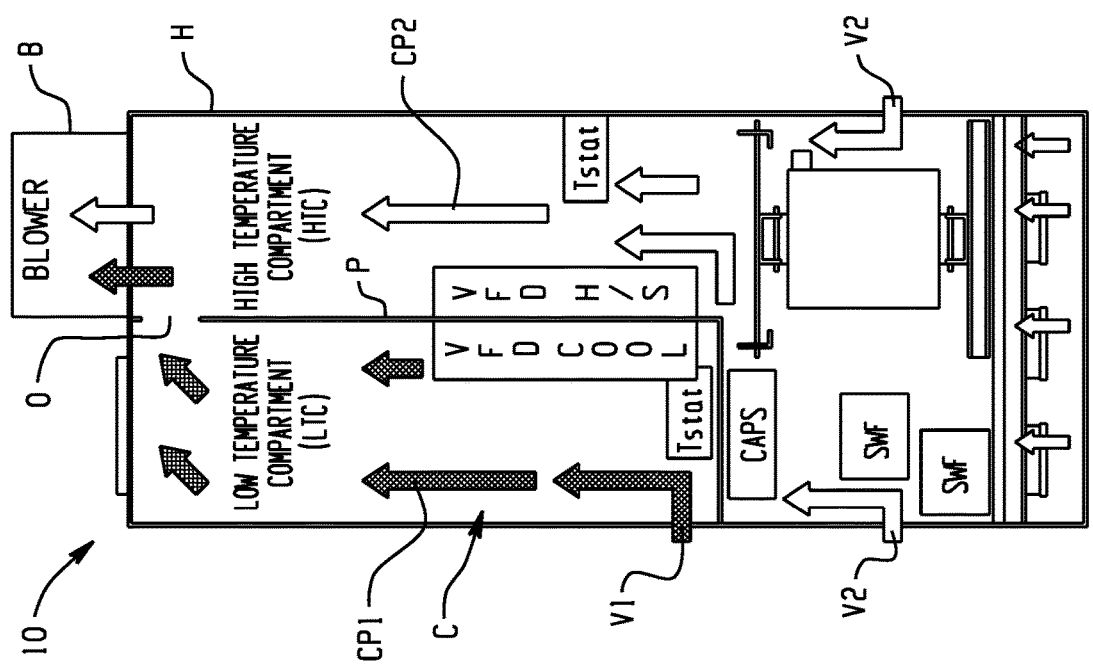
FIG. 2 is a side view of the exemplary enclosure.
Figure 1:
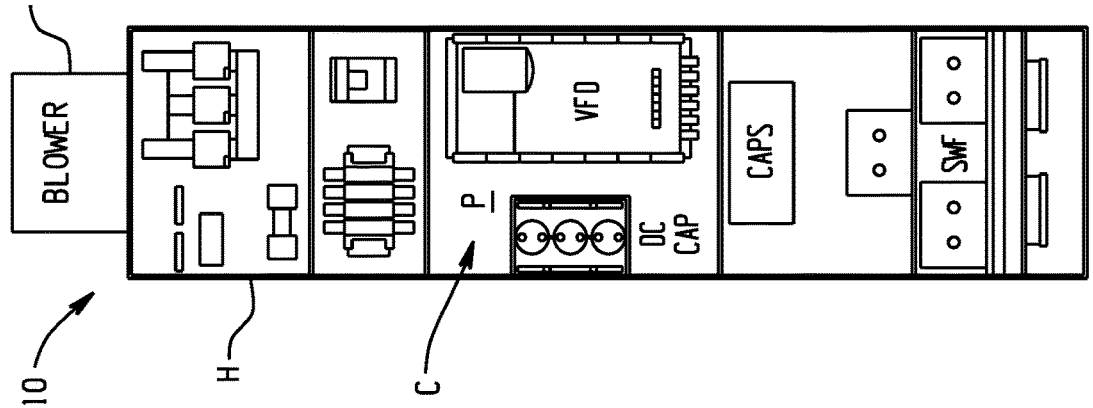
FIG. 1 is a front view of an exemplary enclosure in accordance with the present disclosure.

With reference to FIGS. 1-11, and initially to FIGS. 1-3 an exemplary enclosure 10 in accordance with the present disclosure is schematically illustrated. The exemplary enclosure 10 provides segregated cooling (e.g., low temperature/high temperature) within one enclosure, as well as an arc flash resistant design. As will be described in detail below, certain examples provide a 50 degree C. TYPE 12 thermal packaging cooling system that segregates electronics into a cool side air compartment, power components and magnetics along with higher temp rated parts in a hot side air compartment, all within one cabinet enclosure. Certain examples also provide components in the enclosure (e.g., VFD, DC caps, etc.) to have no more than 5 C rise above ambient in the cool side air compartment.

The enclosure 10 generally comprises a housing H. The housing H defines an internal chamber C, which in the illustrated embodiment is divided by a partition P into two compartments—a low temperature compartment LTC (a first compartment) and a high temperature compartment HTC (e.g., a second compartment). It should be appreciated that the internal chamber C can be divided into additional compartments if desired or necessary.

The low temperature compartment LTC includes a variable frequency drive VFD, and other components configured to operate within the low temperature compartment LTC. In one example, the low temperature compartment LTC is configured to have no more than a 5 degree C. temperature rise over ambient air during operation of the system. The high temperature compartment HTC includes magnetics and associated high power components. In some cases, portions of the same component may reside in both the low temperature compartment LTC and the high temperature compartment HTC (e.g., the VFD as seen in FIG. 2).

Segregating the low temperature compartment LTC from the high temperature compartment HTC is desirable considering the Arrhenius Thermal Degradation Law relationship that component life, in general, decreases ½ for every 10 degree C. rise in temperature. Thus, a low temperature compartment with sensitive electronics, if limited to a 5 C rise, may see a 25% reduction in expected life. However, the same electronics in a high temperature compartment with magnetics and high power dissipating devices, may be subjected to a typical 20 degree C. rise, considered as an optimal cost effective magnetic design. Thus, without thermal cooling segregation, the electronics would suffer a 75% reduction in expected life.

As best seen in FIG. 2, the enclosure 10 includes a first intake vent V1 (three louvered openings shown in later drawings) to receive ambient air into the low temperature compartment LTC, second intake vents V2 (one vent on front and one vent on rear shown in later drawings) to receive ambient air into the high temperature compartment HTC, and a blower B to direct air from both the low temperature compartment LTC and the high temperature compartment HTC out of the enclosure 10. First and second cooling flow paths CP1 and CP2 extend between the vents V1 and V2, respectively, and an exhaust outlet of the blower B. It will be appreciated that any suitable number of intake vents V1 and V2 can be used without departing from the scope of the present disclosure.

In accordance with the present disclosure, cooling flow path CP1 of the low temperature compartment LTC is in fluid communication with the high temperature cooling flow path CP2 via one or more openings O or passageways extending across the partition P. The opening O allows air to exit the low temperature compartment LTC and enter the high temperature compartment at a location adjacent to the blower B, in an upper region of the high temperature compartment HTC. The blower B is configured to direct exhaust air from each of the low temperature compartment LTC and the high temperature compartment HTC out the top of the enclosure 10.

As compared to other enclosure configurations, such as existing enclosures using a fan to blow air from the low temperature compartment LTC out the front (e.g., front door) or sides of the enclosure, or otherwise having upper vents on the sides of the enclosure where arc plasma can discharge in the event of an arc fault, the enclosure 10 directs any arc plasma from the low temperature compartment LTC into the high temperature compartment HTC and/or out of the top of enclosure 10 via the blower 10.

Other than vent V1, the low temperature compartment LTC is generally closed to the ambient except via the opening O and blower B. As such the single blower B directs air from both the low temperature compartment and the high temperature compartment LTC and HTC out of the enclosure 10, and provides an improved exit location for potential arc flashes.

Figure 4:
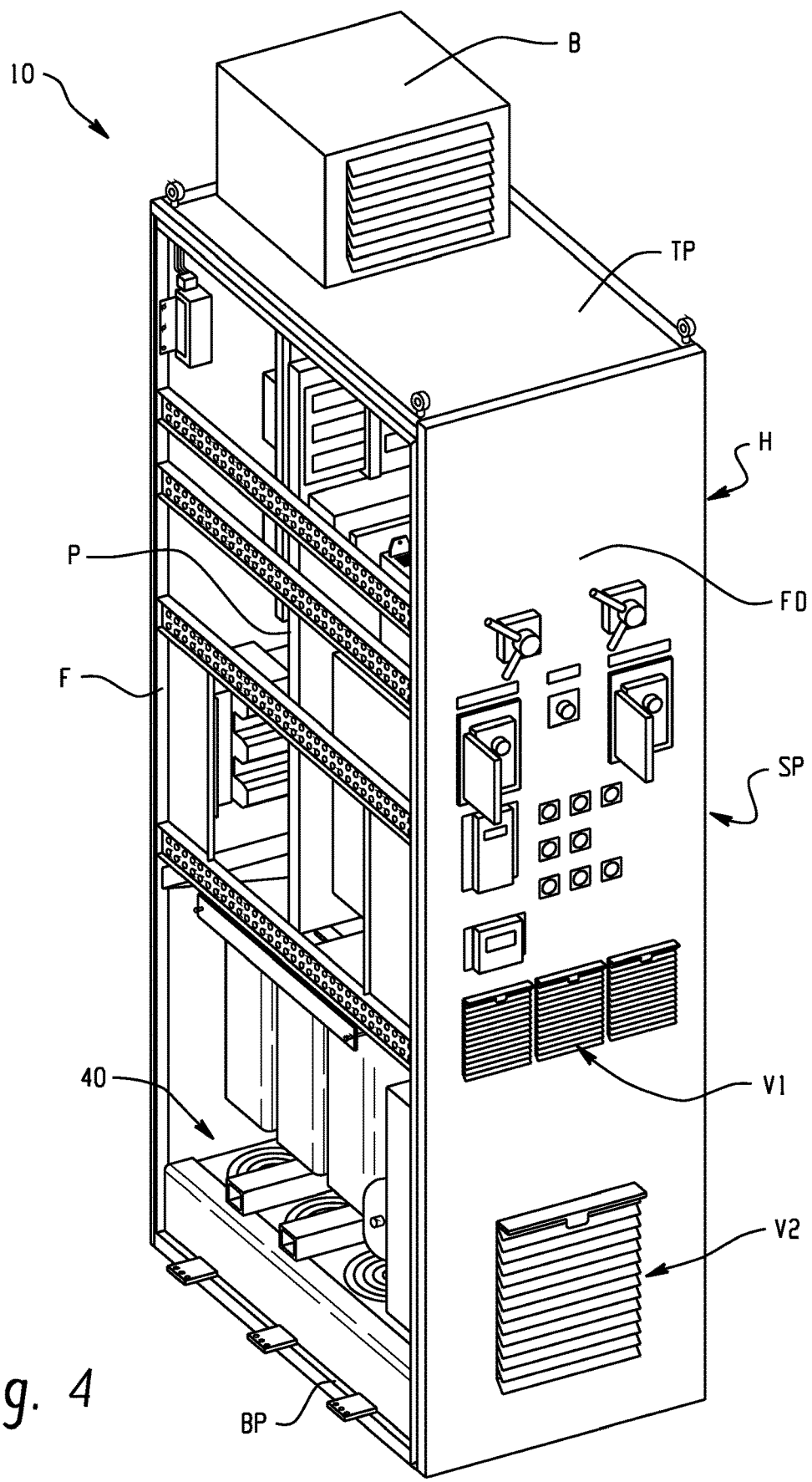
FIG. 4 is a perspective front view of an exemplary enclosure in accordance with the present disclosure.
Figure 5:
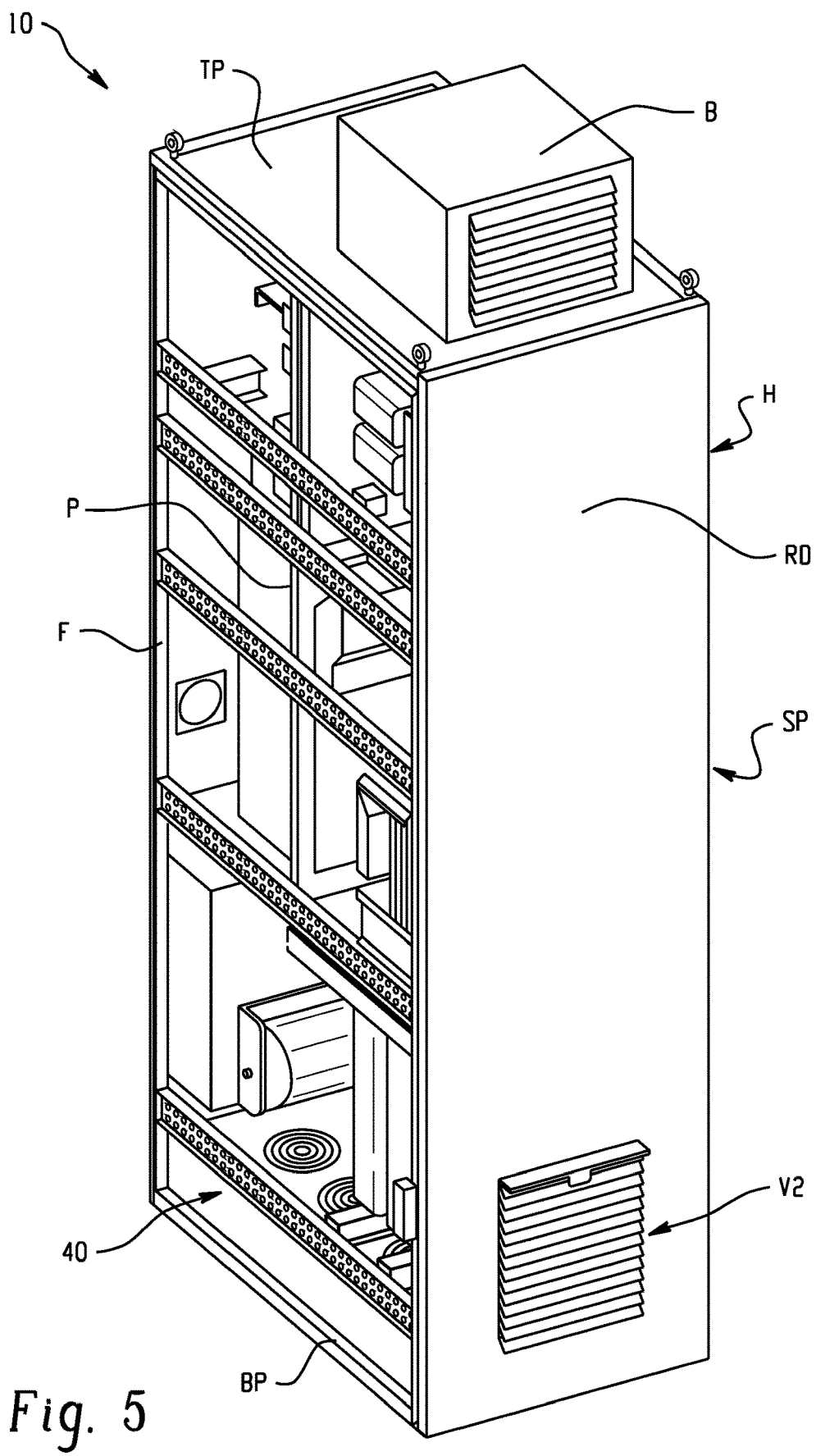
FIG. 5 is a perspective back view of the exemplary enclosure of FIG. 4.

For example, as shown in FIGS. 4 and 5, it will be appreciated that the housing H of the enclosure 10 is generally comprised of a plurality of panels (e.g., side panels SP, top panel TP, bottom panel BP) mounted to an internal frame structure F (side panel SP removed in FIGS. 4 and 5). The enclosure 10 further includes front and rear doors FD and RD (or panels) for permitting access to the interior compartments. As can be seen, the only openings in the front and rear doors FD and RD are the vents V1 and V2 for admitting cooling air into the respective low temperature compartment LTC and high temperature compartment HTC.

The example enclosure 10 includes a large powerful TYPE 12 hot side blower B to pull air from the low temperature compartment LTC and the high temperature compartment HTC, and reduces costs by eliminating door venting and/or door mounted fans (e.g., the doors do not have an exhaust vent). Disclosed examples also facilitate meeting a less than 5 degree C. rise for the VFD, electronics, low voltage power supply sensors (e.g., associated feedback voltage and current sensors), etc. inside the low temperature (cool) compartment LTC for high reliability and long life (since every 10 C cuts life in half).

Figure 6:
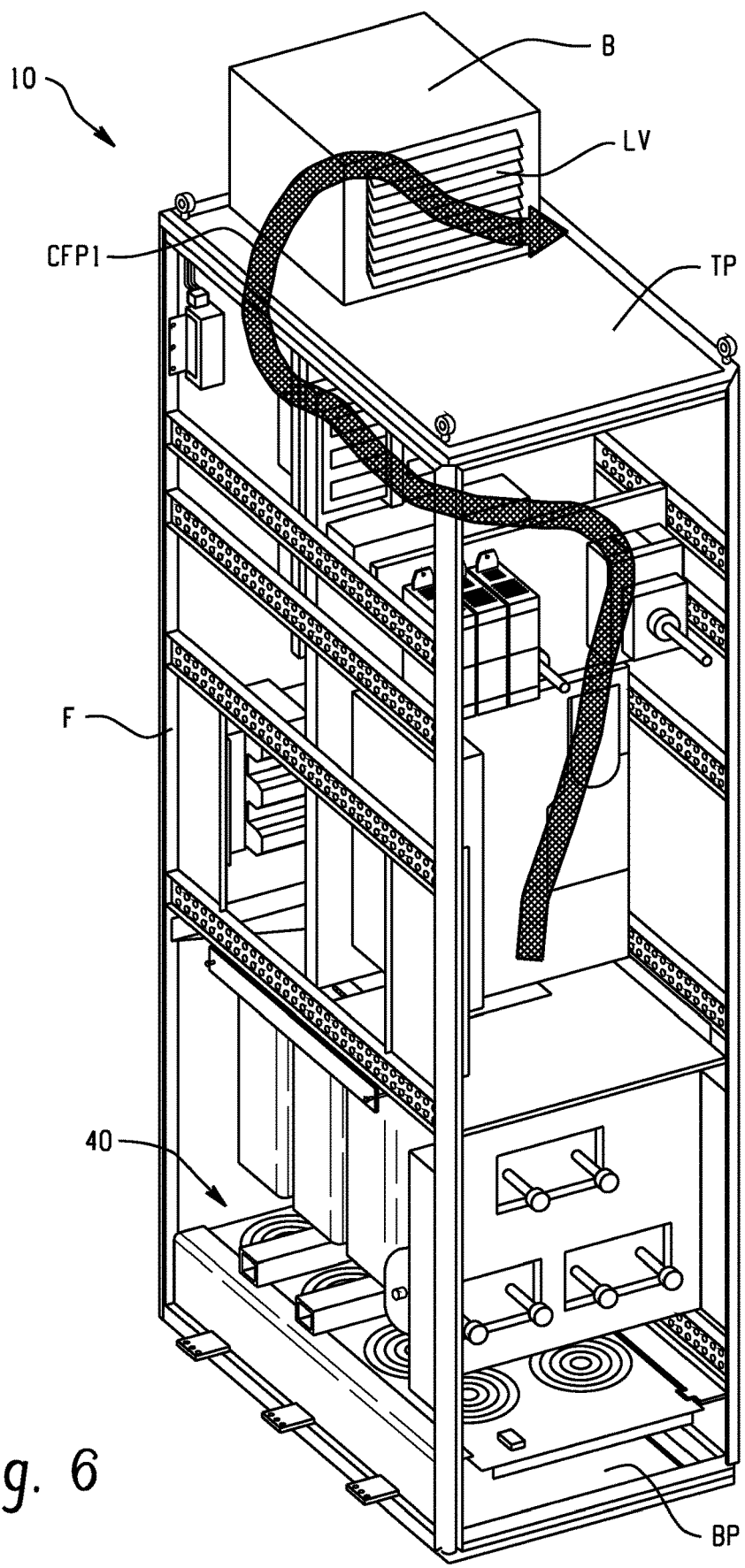
FIG. 6 is a perspective front view of the enclosure with the housing removed to illustrate a first arc flash path discharging out a top of the enclosure to a front/rear of the enclosure.
Figure 7:
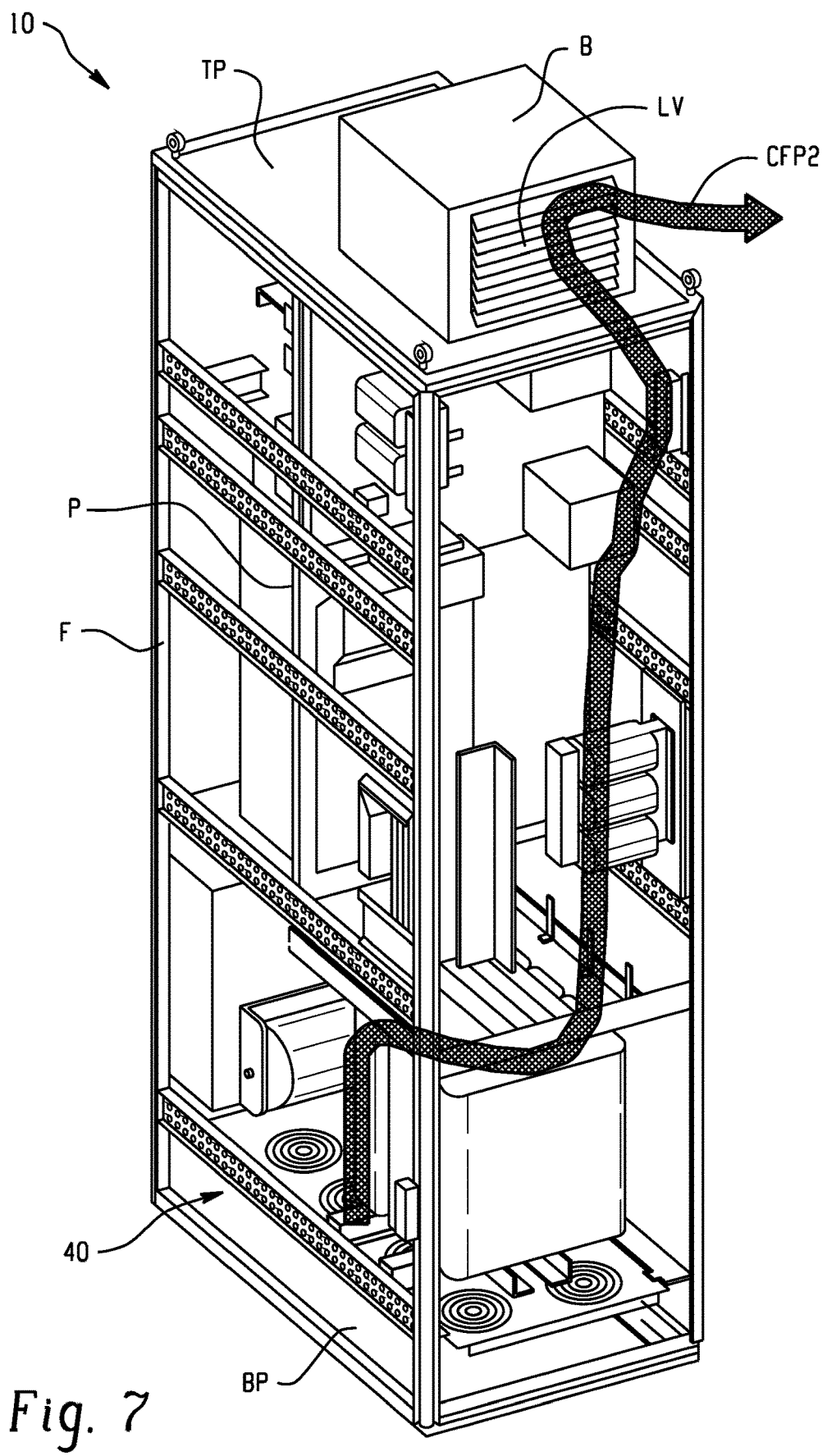
FIG. 7 is a perspective rear view of the enclosure with the housing removed to illustrate a second arc flash path discharging out a top of the enclosure to a front/rear of the enclosure.

With additional reference to FIGS. 6 and 7, the enclosure 10 of the present exemplary embodiment provides, in addition to the segregated cooling paths, improved arc flash resistance. It will be appreciated that the side panels SP and front and rear doors FD and RD have been removed from the enclosure 10 shown in FIGS. 6 and 7 so that the arc flash paths of both the low temperature compartment LTC and high temperature compartment HTC can be illustrated. Arc flash incidents may possibly occur as a result of electrical components failing short across the incoming ac power line, limited only by the power source short circuit current interrupt rating. While circuit protection is opening as fast as possible within a few power line cycles, the arc created and expanding gas reaches extreme high temperatures and pressures and will find immediate available openings to exhaust. One objective of the exemplary cabinet design is to provide improved arc flash personnel protection as to re-direct the most likely arc path upwards and away from nearby personnel, where it can be dissipated safely as the expanding high temperature gases find the path of least resistance through the powerful roof mounted blower B.

In FIG. 6, the cool side arc flash path CFP1 is shown. The enclosure 10 is configured such that an arc fault emanating from near vent V1 will travel upwardly through the low temperature compartment LTC, through the one or more openings O in partition P into the high temperature compartment HTC, and upward and out to the ambient environment through the blower B. As such, the cool side arc flash path CFP1 makes at least two 90 degree turns prior to entering the blower B. The blower B in this embodiment has a louvered vent LV facing towards the front/rear of the enclosure 10.

In FIG. 7, the hot side arc flash path CFP2 is shown. The enclosure is configured such that an arc fault emanating from near the bottom of the enclosure 10 will travel upwardly in the high temperature compartment HTC and out the blower B via louvered vent LV. It should be appreciated that terminal portions of both the cool side arc flash path CFP1 and the hot side arc flash path CFP2 extend in common from the upper portion of the high temperature compartment HTC out to ambient through the blower B.

Also shown in FIGS. 6 and 7, the top panel TP of the enclosure 10 in one example includes an entry/exit gasketed removable gland plate. An 18 pulse output isolation transformer and the VFD output sinewave filter inductors are also shown illustrated along with the 18 pulse diode rectifier and DC OUTPUT anode blocking diodes, as well as an AC input line reactor and the 18 pulse output isolation transformer. FIGS. 6 and 7 also illustrate a removable fan assembly 40 at the bottom of the enclosure 10 which blows input air through the sinewave filter inductors and the output isolation transformer for the 18 pulse diode rectifier which generates the variable dc voltage for electroplating. Further details of exemplary electric/electronics components that can be supported in the exemplary enclosures of the present disclosure are set forth in U.S. patent application Ser. No. 15/465,110, filed Mar. 21, 2017.

Figure 8:
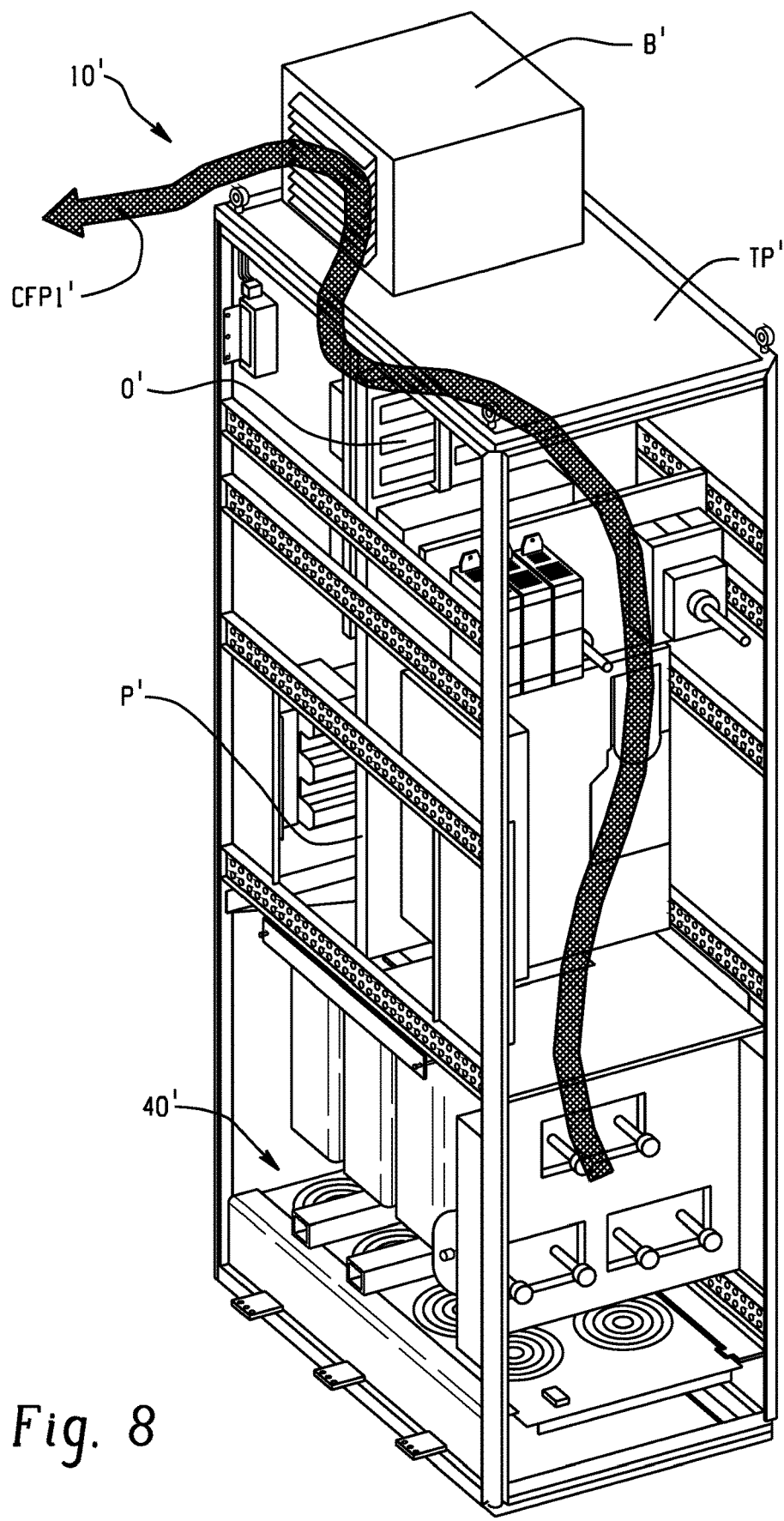
FIG. 8 is a perspective front view of another exemplary enclosure in accordance with the present disclosure with the housing removed to illustrate a first arc path discharging out a top of the enclosure to a side of the enclosure.
Figure 9:
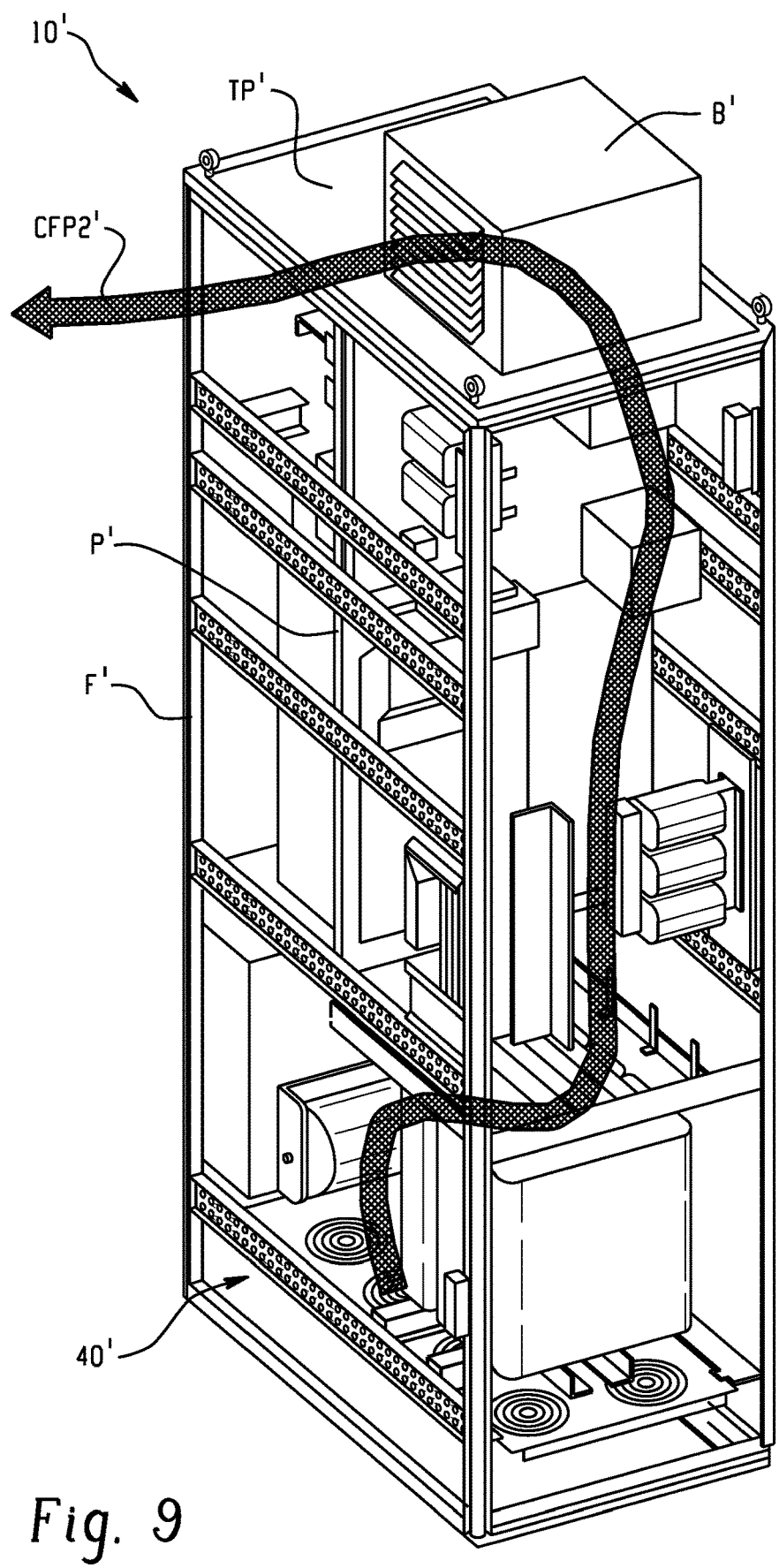
FIG. 9 is a perspective rear view of the enclosure with the housing removed to illustrate a second arc flash path discharging out a top of the enclosure to a side of the enclosure.

FIGS. 8 and 9 illustrate another exemplary enclosure 10' in accordance with the present disclosure wherein components previously described in connection with FIGS. 1-7 are indicated with the same reference numerals denoted by a single "prime." For the sake of brevity, only features of the enclosure 10' that differ from the enclosure 10 will be described. In this alternative embodiment, the louvered vent LV' of the blower B' is arranged to exhaust to the sides of the enclosure 10' instead of on the front and back (e.g., as illustrated in the embodiment shown in FIGS. 4-7).

Figure 10:
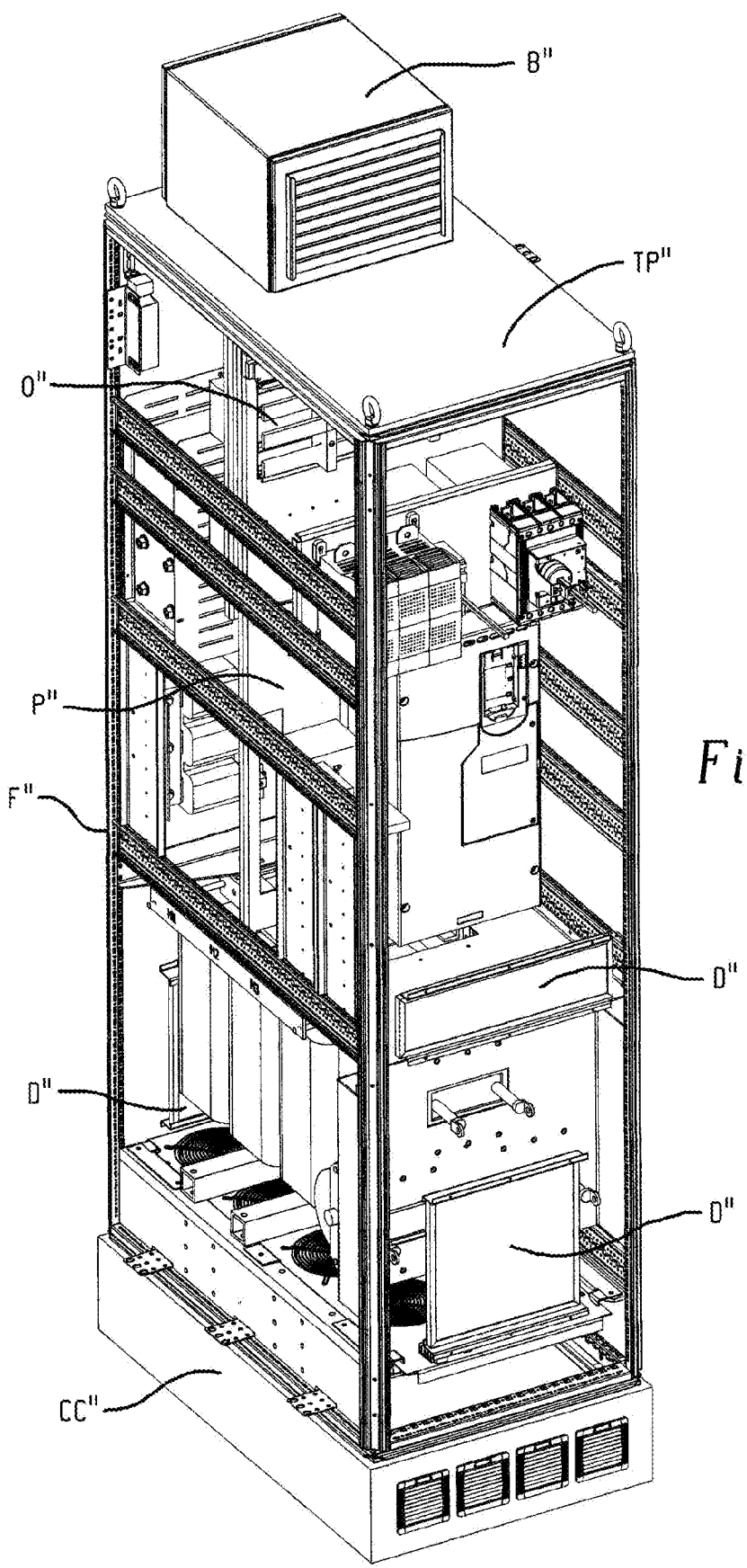
FIG. 10 is a perspective front view of another exemplary enclosure in accordance with the present disclosure with the housing removed to illustrate certain internal features.

FIG. 10 illustrates another exemplary enclosure 10" in accordance with the present disclosure wherein components previously described in connection with FIGS. 1-7 are indicated with the same reference numerals denoted by a double "prime." For the sake of brevity, only features of the enclosure 10" that differ from the enclosure 10 will be described. The side panels and doors of the enclosure 10" are not illustrated in FIG. 9 so that the internal components of the enclosure can be seen. In this embodiment, the enclosure 10 is supported on a cable chamber CC". In addition, arc deflectors D" (e.g., arc resistant baffles) are installed behind each of the vents V1 and V2. The arc deflectors D" are configured to deflect any arc plasma that would otherwise travel out of vents V1 and/or V2 in the case of an arc fault. An exemplary arc resistant baffle is set forth in commonlyassigned U.S. Pat. No. 7,778,013 issued on Aug. 17, 2010, the contents of which is incorporated herein by reference in its entirety.

Figure 11:
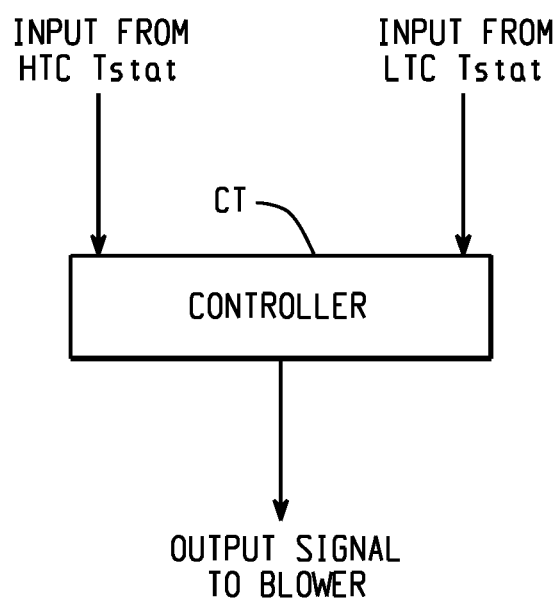
FIG. 11 is a schematic illustration of an exemplary controller for controlling a blower in accordance with the present disclosure.

Turning to FIG. 11, it should be understood that the blower of any of the above-described embodiments can be controlled to operate with a desired profile. To this end, thermostats can be mounted within or adjacent to one or both of the high temperature compartment and the low temperature compartment (see FIG. 2). The thermostats can provide a signal to a controller CT that is configured to activate the blower at one or more speeds based at least in part on the signal received from one or both of the thermostats. The controller CT can be integral with the blower, or can be a standalone unit, or can be part of another system. It should be appreciated that, in some embodiments, the controller CT is optional, and that it is possible to directly control the blower with the thermostats.

In one configuration, the blower can be operated at a first speed when both of the thermostats are below their respective set-points. When at least one of the thermostats exceeds its set-point, the blower can then be operated at a second speed. In one example, the first speed is a low speed and the second speed is a high speed. A shutdown timer can be provided for running the blower for a certain time period after shutdown of the electrical/electronic components.

In operation, the low temperature compartment LTC will likely rise above the set-point temperature before the high temperature compartment. However, by running the blower at a lower speed during at least a portion of the time, bearing life can be increased while blower noise is reduced.

It will now be appreciated that the present disclosure sets forth an enclosure that limits exposure of personnel to arc flash hazards by redirecting any arc flash out the top of the enclosure, upward and away from personnel in the vicinity.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An enclosure, comprising:
    a first compartment to operate at a first controlled temperature range, the first compartment including a variable frequency drive;
    a second compartment to operate at a second controlled temperature range higher than the first controlled temperature range, the second compartment including magnetics and higher temperature rated components,
    a first intake vent to receive ambient air into the first compartment;
    a second intake vent to receive ambient air into the second compartment; and
    a blower to direct air from both the first and second compartments out of the enclosure;
    wherein ambient air received in the first compartment flows along a first cooling path extending from the first intake vent to the blower;
    wherein ambient air received in the second compartment flows along a second cooling path extending from the second intake vent to the blower; and
    wherein a terminal portion of the first flow path joins the second flow path prior to the blower.

2. The enclosure of claim 1, further comprising a partition at least partially separating the first compartment from the second compartment, and at least one opening in the partition through which the first flow path extends from the first compartment into the second compartment.

3. The enclosure of claim 2, wherein the at least one opening is at an upper portion of the partition adjacent a top panel of the enclosure.

4. The enclosure of claim 1, further comprising at least one door for accessing the first compartment.

5. The enclosure of claim 1, wherein the at least one door includes the first intake vent, wherein the first intake vent is the only pathway to the ambient environment through the door.

6. The enclosure of claim 1, wherein the blower is a TYPE 12, 50 degree C. 2-speed blower.

7. The enclosure of claim 1, wherein a first arc flash path of the first compartment extends between the first intake vent and the blower, the arc flash path making at least two 90 degree turns prior to the blower.

8. The enclosure of claim 7, wherein a second arc flash path of the second compartment extends between the second intake vent and the blower, the first arc flash path and the second arc flash path being coextensive within at least a portion of the second compartment.

9. The enclosure of claim 8, wherein both the first arc flash path and the second arc flash path exit the enclosure through a top panel of the enclosure.

10. An enclosure for electrical equipment comprising:
    a low temperature compartment to operate at a first controlled temperature range, the low temperature compartment configured to house a first set of associated electrical components;
    a high temperature compartment to operate at a second controlled temperature range higher than the first controlled temperature range, the high temperature compartment configured to house a second set of associated electrical components;
    a first intake vent to receive ambient air into the low temperature compartment;
    a second intake vent to receive ambient air into the high temperature compartment; and
    a blower to direct air from both the low temperature compartment and the high temperature compartment out of the enclosure;
    wherein ambient air entering the low temperature compartment flows along a first cooling path extending from the first intake vent to the blower;
    wherein ambient air entering the high temperature compartment flows along a second cooling path extending from the second intake vent to the blower; and
    wherein a terminal portion of the first flow path joins the second flow path prior to the blower.

11. The enclosure of claim 10, further comprising a partition at least partially separating the low temperature compartment from the high temperature compartment within the enclosure, and at least one opening in the partition through which the first flow path extends from the low temperature compartment into the high temperature compartment.

12. The enclosure of claim 11, wherein the at least one opening is at an upper portion of the partition adjacent a top panel of the enclosure.

13. The enclosure of claim 10, further comprising at least one door for accessing the first compartment.

14. The enclosure of claim 13, wherein the at least one door includes the first intake vent, wherein the first intake vent is the only pathway to the ambient environment through the door.

15. The enclosure of claim 10, wherein the blower is a TYPE 12, 50 degree C. 2-speed blower.

16. The enclosure of claim 10, wherein a first arc flash path of the low temperature compartment extends between the first intake vent and the blower, the arc flash path making at least two 90 degree turns prior to the blower.

17. The enclosure of claim 16, wherein a second arc flash path of the high temperature compartment extends between the second intake vent and the blower, the first arc flash path and the second arc flash path being coextensive within at least a portion of the second compartment.

18. The enclosure of claim 17, wherein both the first arc flash path and the second arc flash path exit the enclosure through a top panel of the enclosure.

* * * * *